United States Patent
Kim et al.

(10) Patent No.: US 7,718,077 B1
(45) Date of Patent: May 18, 2010

(54) FABRICATING A STRUCTURE USABLE IN AN IMPRINT LITHOGRAPHIC PROCESS

(75) Inventors: Han-Jun Kim, Palo Alto, CA (US); Carl P. Taussig, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 417 days.

(21) Appl. No.: 11/493,478

(22) Filed: Jul. 25, 2006

(51) Int. Cl.
*B44C 1/22* (2006.01)

(52) U.S. Cl. .............................. 216/11; 216/2; 216/41; 216/44; 216/47

(58) Field of Classification Search .................... 216/2, 216/11, 41, 44, 47
See application file for complete search history.

(56) References Cited

U.S. PATENT DOCUMENTS

| | | | | |
|---|---|---|---|---|
| 5,738,757 A | * | 4/1998 | Burns et al. | 438/603 |
| 5,772,905 A | * | 6/1998 | Chou | 216/44 |
| 6,811,853 B1 | * | 11/2004 | Sherrer et al. | 428/138 |
| 7,396,475 B2 | * | 7/2008 | Sreenivasan | 216/2 |
| 2005/0285308 A1 | * | 12/2005 | Hattori et al. | 264/293 |

* cited by examiner

*Primary Examiner*—Shamim Ahmed

(57) ABSTRACT

A method of fabricating an article usable in an imprint lithographic process is disclosed. The method includes patterning masking material layers on a substrate thereby forming a multi-layer mask and sequentially removing portions of the substrate based on the multi-layer mask to thereby forming a structure usable in an imprint lithographic process.

12 Claims, 8 Drawing Sheets

(a)

(b)

(c)

(d)

FABRICATING A STRUCTURE USABLE IN AN IMPRINT LITHOGRAPHIC PROCESS

FIELD OF THE INVENTION

The present invention relates generally to imprint lithography and more particularly to a method and system for fabricating a structure usable in an imprint lithographic process.

BACKGROUND OF THE INVENTION

There is currently a strong trend toward downsizing existing structures and fabricating smaller structures. This process is commonly referred to as microfabrication. One area in which microfabrication has had a sizeable impact is in the microelectronic area. In particular, the downsizing of microelectronic structures has generally allowed the structures to be less expensive, have higher performance, exhibit reduced power consumption and contain more components for a given dimension. Although microfabrication has been widely active in the electronics industry, it has been applied to other applications such as biotechnology, optics, mechanical systems, sensing devices, and reactors.

One method employed in the microfabrication process is imprint lithography. Imprint lithography is typically utilized to transfer the original features of a stamp or mold onto softer materials. The imprinted materials may be used either as the final structures or etch masks to pattern underlying thin films. The thin films patterned can be dielectrics, semiconductors, metals or organics. Implementation of this method encompasses an initial step of making an imprint mold or stamp. To make such devices as diodes and transistors using imprint lithography, a single stamp may be required to contain all the pre-aligned information for the subsequent processing steps, and thus, needs to be three dimensional in shape.

Silicon microprocessing technologies, which include photolithography and plasma etching, are often used for fabricating stamps for imprint lithography. With the conventional methodologies of microprocessing, a minimum feature in the sub-micron or nano-meter scales can be defined in a reliable and repeatable manner. However, achieving complex 3-dimensional (3D) structures with multiple levels is limited as non-planarity of the surface increases.

There are two reasons for the limitation. First, focusing capability of the photolithographic optics is lost as the relative height of one surface from another exceeds its depth of focus (DOF). Second, it becomes increasingly difficult to obtain a thin uniform film of photoresist of spin coating once higher aspect ratio features are present. These attributes are more pronounced where feature size is smaller and the overall geometry is more complex. As a result, the conventional approaches are limited in achieving complex 3D features with a high aspect ratio and multiple levels.

Accordingly, what is needed is a method and system that addresses the above-delineated problems associated with the fabrication of microprocess equipment. The method and system should be simple, cost effective and capable of being easily adapted to existing technology. The present invention addresses this need.

DETAILED DESCRIPTION

The present invention relates to a method and system for fabricating a structure usable in an imprint lithographic process. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

Varying embodiments of a method and system for fabricating a structure usable in an imprint lithographic process are disclosed. Through the use of the disclosed embodiments, a binary process is implemented whereby lithography steps are performed prior to the etching steps in the fabrication process. As a result, a structure usable in an imprint lithographic process with complex 3D features, high aspect ratio and multiple levels can be patterned in a more feasible fashion.

Figure 1:
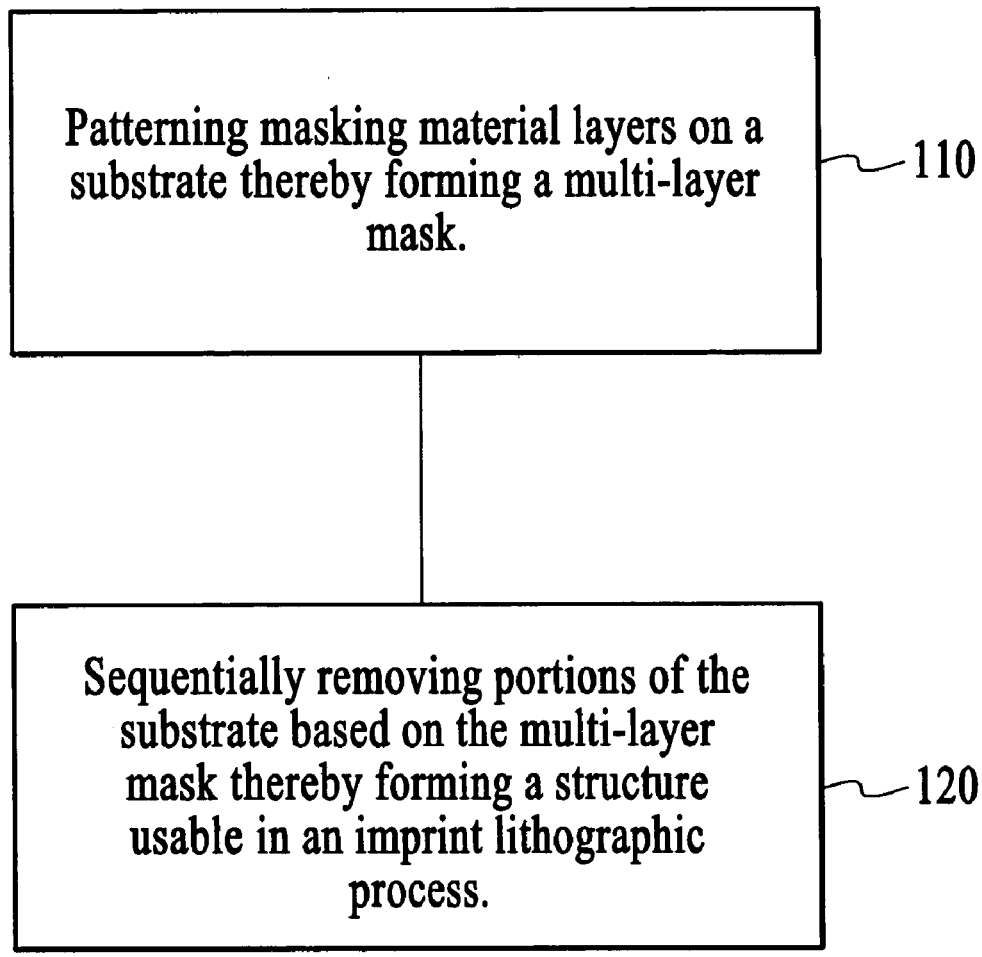
FIG. 1 is a high level flow chart of a method in accordance with an embodiment of the present invention.

FIG. 1 is a high-level flow chart of a method of fabricating a structure in accordance with an embodiment. A first step 110 includes patterning masking material layers on a substrate material thereby forming a multi-layer mask. A second step 120 involves sequentially removing portions of the substrate based on the multi-layer mask thereby forming a structure usable in an imprint lithographic process. In an embodiment, the resulting structure is a master mold, an imprint stamp or the like that can be used in an imprint lithographic process.

In an embodiment, step 110 can be accomplished through the use of masking material layers such as photoresist, chromium (Cr) and silicon dioxide ($SiO_2$). It should be noted that the embodiments are not limited to the implementation of these materials. One of ordinary skill in the art will readily recognize that a variety of different material could be employed.

In these embodiments, the Si "substrate" itself is etched so that the 3D features are formed into the substrate surface. But for different applications, the 3D features may be formed on or through any material(s) deposited on top of the substrate. For example, one may want to grow or deposit oxide on the Si substrate and form the features on or through it so that the surface becomes hydrophilic. (Si is hydrophobic, while $SiO_2$ is hydrophilic.)

Accordingly, in an alternate embodiment, the substrate can include one or a plurality of layers of material. If the substrate includes a plurality of layers, step 120 can be accomplished by removing portions of one or more of the plurality of layers. For example, step 120 could include removing portions of only a top layer of the plurality of layers or step 120 could include removing portions of the top layer and at least one of the layers beneath the top layer.

In an embodiment, step 120 is accomplished through the performance of a series of etches after the deposition and patterning of each of the masking material layers. This can be accomplished by selecting masking material layers that are mutually etch selective. Stated another way, the masking material layers have etch properties whereby each material can be etched at a much greater rate than the other under certain conditions, e.g. for materials A and B, the etch for material 'A' does not affect material 'B' and the etch for material 'B' does not material 'A'. These conditions may include different etch chemistries, different types of plasmas, different flow rates, different partial pressures, different plasma power, different temperatures, etc.

Although the masking materials are meant to be etch selective with respect to one another, the masking materials should also be etch selective with respect to the substrate. Furthermore, etch selectivity can also depend on the type of etching system (i.e. type(s) of plasma or wet etchant) implemented. For example, in an embodiment, a dry etch can be implemented with a Si substrate whereby $SiO_2$ and photoresist layers are employed as masking material layers. Accordingly, resist developer solution is highly etch selective to $SiO_2$ and Si. Furthermore, $CF_4$ and $SF_4$ plasmas may be used for selectively dry etching the oxide and Si, respectively, while avoiding or minimizing the removal of the other materials.

In an alternate embodiment, a wet etch can be implemented with an Si substrate whereby Cr and photoresist layers are employed as masking material layers. Accordingly, resist developer solution is highly etch selective to Cr and Si. Furthermore, ceric ammonium nitrate solution may be used for selectively etching Cr with respect to Si and the photoresist. As for the selective etching of Si, a mixture of hydrofluoric acid, nitric acid and acetic acid can be employed.

An advantage to implementing this process is that once the masking material layers have been selectively etched, the remaining masking material is relatively thinner than the trenches to be etched into the substrate thereby allowing the masking materials to remain in the permitted DOF range of photolithographic optics. This allows the subsequent substrate etching process to be performed in an easier fashion.

Figure 2:
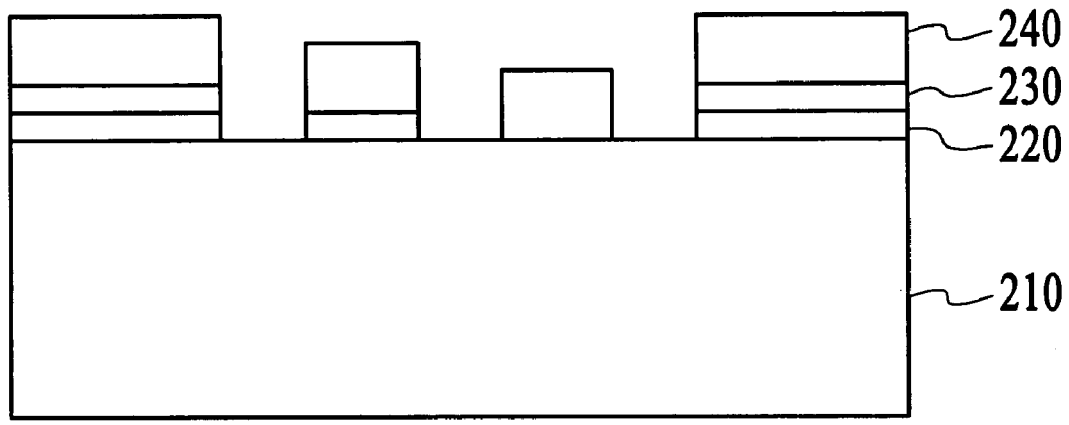
FIG. 2 shows a structure after the deposition and etching of three masking material layers in accordance with an embodiment of the present invention.

Referring to FIG. 2, a structure 200 is shown after the deposition and etching of three masking material layers. The first, second and third masking material layers 220, 230, 240 are respectively shown on a substrate material 210 and form a multi-layer mask. It should be noted that the third masking material layer 240 (top mask layer) represents the bottom level pattern of the resulting structure and the first masking material layer 220 (bottom mask layer) represents the top level pattern of the resulting structure.

Figure 3:
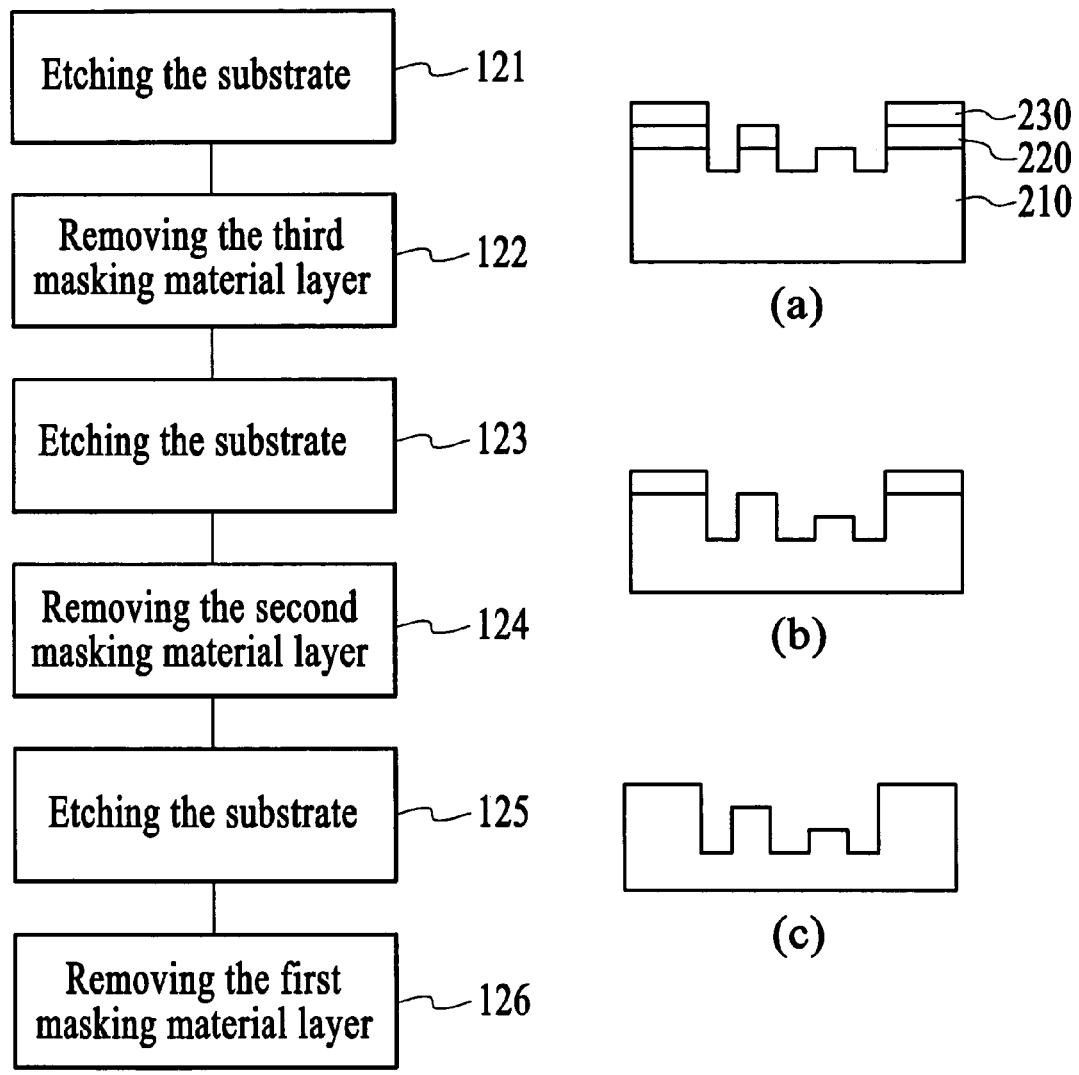
FIG. 3 and the accompanying FIGS. 3(a-c) illustrate a more detailed flowchart of step 120 in accordance with an embodiment of the present invention.

FIG. 3 and the accompanying FIGS. 3(*a-c*) illustrate a more detailed flowchart of step 120. A first step 121 includes etching the substrate.

A second step 122 includes removing the third masking material layer. FIG. 3(*a*) shows the resulting structure after steps 121 and 122. Here, third mask layer is removed. The etch characteristics of the other two masking material layers 220, 230 and the substrate 210 are mutually etch selective.

A next step 123 includes etching the substrate.

A next step 124 includes removing the second masking material. FIG. 3(*b*) shows the resulting structure after steps 123 and 124. Here, the etch characteristics of the second masking material layer and the substrate are mutually etch selective with regard to the first masking material layer.

Step 125 includes etching the substrate.

A final step 126 includes removing the first masking material layer. FIG. 3(*c*) shows the resulting structure after steps 125 and 126. In an embodiment, the resulting structure is a microprocessing mold or stamp usable in an imprint lithographic process.

The etching steps can be performed utilizing one of a variety of different directional etching techniques. These techniques include, but are not limited to, ion-milling and anisotropic reactive ion etching (RIE).

Ion-milling is a physical dry etching technique where a sample is exposed to a collimated beam of accelerated, monoenergetic inert ions thereby removing material due to ion impingement. The ion-milling systems typically incorporate a double-gridded ion source of the Kaufman type that supply acceleration voltages ranging from ~200 V to ~1.5 kV. Argon (p~2E-4 Torr) is typically used as the working gas. The sample is mounted on a rotating water-cooled stage that can be tilted with respect to the incoming Ar-ions.

Ion-milling is used for the fabrication of sub-micron gatings as well as for structuring samples incorporating very different materials such as metal/insulator/semiconductor-combination since the etch rates of these materials are of comparable magnitude (e.g. GaAs: 80 nm/min, Au: 75 nm/min, silicon nitride: 25 nm/min, photoresist: ~20 nm/min for 500 eV-Ar ions). Accordingly, ion-milling provides a very flexible tool for the performance of directional etching.

In RIE, the substrate is placed inside a reactor in which several gases are introduced. A plasma is struck in the gas mixture using an RF power source, breaking the gas molecules into ions. The ions are accelerated towards, and reacts at, the surface of the material being etched, forming another gaseous material. This is known as the chemical part of reactive ion etching. There is also a physical portion which is similar in nature to the sputtering deposition process.

If the ions have high enough energy, they can knock atoms out of the material to be etched without a chemical reaction. It is a very complex task to develop dry etch processes that balance chemical and physical etching since there are many parameters to adjust. By changing the balance it is possible to influence the anisotropy of the etching, since the chemical part is isotropic and the physical part is highly anisotropic. Accordingly, RIE is capable of performing a very directional etch.

Although the above disclosed embodiment is described in terms of being implemented with three masking material layers, one of ordinary skill in the art will readily recognize that the concept could be implemented with a different number of masking material layers. Also, by combining mask etching steps in between the substrate etching steps and changing the order of the process sequence various types of cross-sectional geometries of the resulting structure can be achieved.

Figure 4:
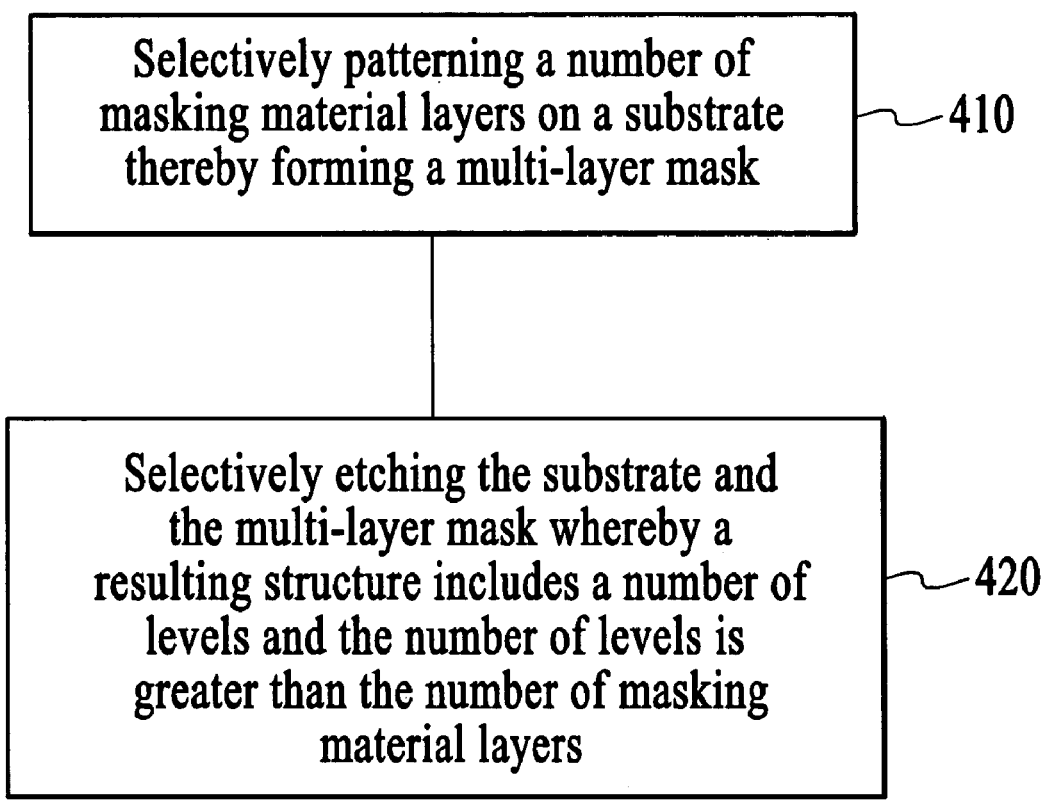
FIG. 4 shows a flow chart of yet another alternate embodiment of the present invention.

Accordingly, FIG. 4 shows a flowchart of an alternate embodiment. A first step 410 includes selectively patterning a number of masking material layers on a substrate thereby forming a multi-layer mask. A second step 420 includes selectively etching the substrate and the multi-layer mask whereby a resulting structure includes a number of levels and the number of levels is greater then the number of masking material layers.

In an embodiment, the etching steps can be performed whereby if the number of masking material layers is n, the maximum number of levels that can be formed is $2^n$. For example, if 2 masking material layers are employed, 4 levels can be achieved, if 3 masking material layers are employed, 8 levels can be achieved, etc.

Figure 5:
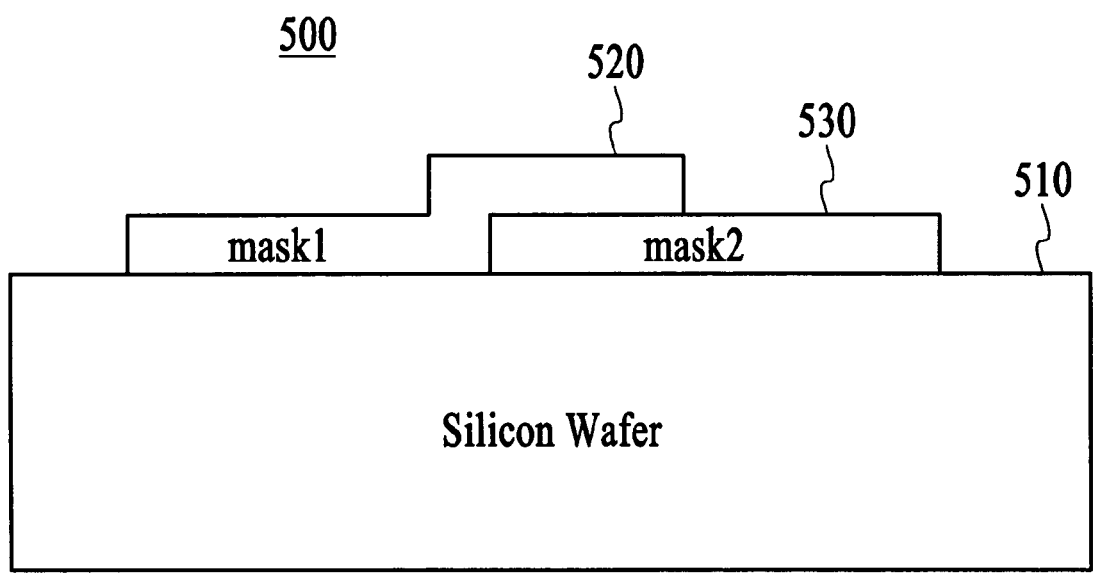
FIG. 5 shows a structure after the deposition and patterning of two masking material layers in accordance with an alternate embodiment of the present invention.

Again, by combining mask etching steps in between the substrate etching steps and changing the order of the process sequence, various types of cross-sectional geometries of the resulting structure can be achieved. For a better understanding, please refer to FIG. 5. FIG. 5 shows a structure 500 after the deposition and patterning of two masking material layers. The first and second masking material layers 520, 530 are deposited on a substrate material 510.

Figure 6:
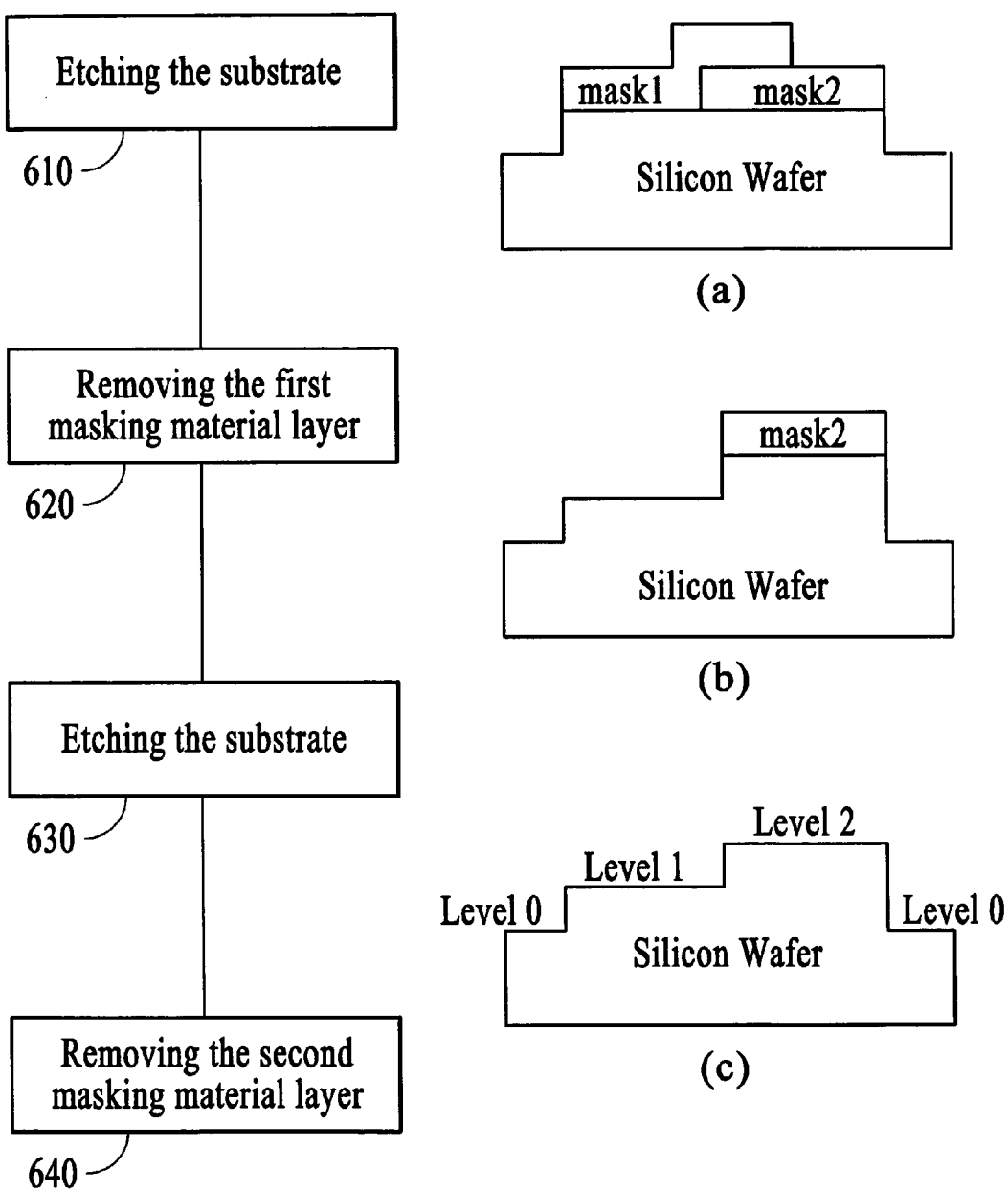
FIG. 6 and the accompanying FIGS. 6(a-c) show a flow chart of another alternate embodiment of the present invention.

Referring to FIG. 6 and the accompanying FIGS. 6(*a-c*), a first step 610 includes etching the substrate. FIG. 6(*a*) shows the resulting structure after the performance of the substrate etch. Here, the etch characteristics of the masking material layers and the substrate are mutually etch selective.

A next step 620 includes removing the first masking material layer.

A next step 630 includes etching the substrate. FIG. 6(*b*) shows the resulting structure after the removal of the first masking material layer and the substrate etch. Here, the etch characteristics of the second masking material layer and the first masking material layer are mutually etch selective.

A next step 640 includes removing the second masking material layer. FIG. 6(*c*) shows the resulting structure after the removal of the second masking material layer. As can be seen, two layers of masking materials are employed to create a structure with three levels.

Figure 7:
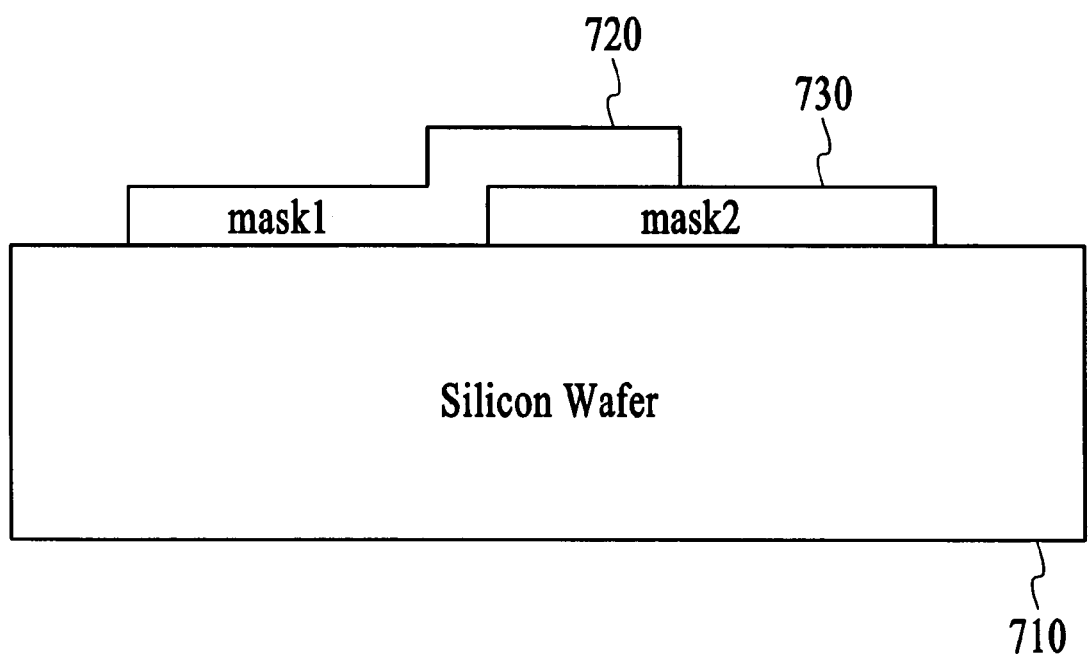
FIG. 7 shows a structure after the deposition and patterning of two masking material layers in accordance with another embodiment of the present invention.
Figure 8:
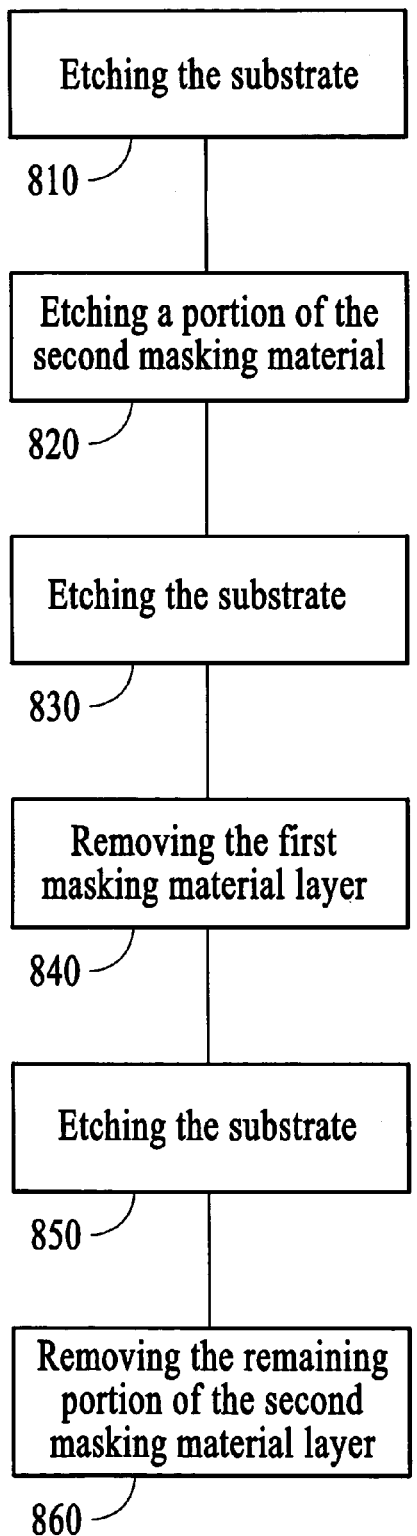
FIG. 8 and the accompanying FIGS. 8(a-d) show a flow chart of an alternate embodiment of the present invention.
Figure 8:
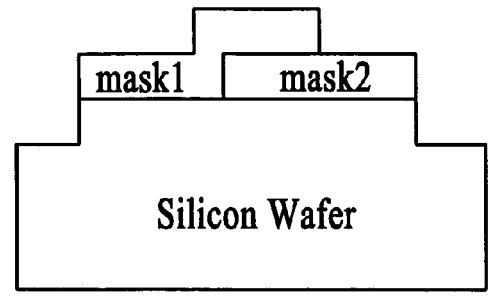
Figure 8:
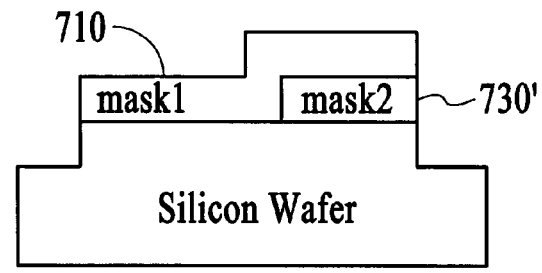
Figure 8:
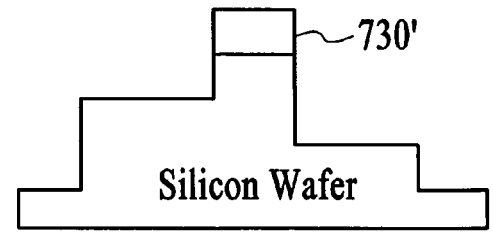
Figure 8:
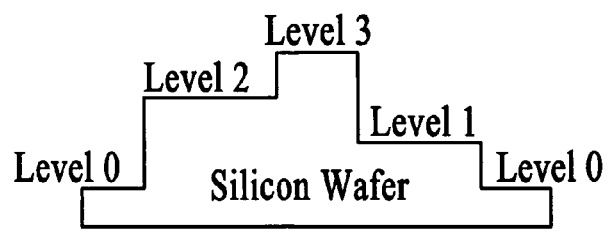

FIGS. 7 and 8 illustrate yet another embodiment. FIG. 7 shows a structure 700 after the deposition and patterning of two masking material layers. The first and second masking material layers 720, 730 are deposited on a substrate material 710.

Referring to the flowchart of FIG. 8 and the accompanying FIGS. 8(*a-d*), a first step 810 includes etching the substrate. FIG. 8(*a*) shows the resulting structure after the performance of the substrate etch. Here, the etch characteristics of the masking material layers and the substrate are mutually etch selective.

A next step 820 includes etching a portion of the second masking material layer. In an embodiment, the first masking material layer is employed as a mask.

A next step 830 includes etching the substrate. FIG. 8(*b*) shows the resulting structure after the second masking material layer and the substrate are etched. Here, the etch characteristics of the second masking material layer and the first masking material layer are mutually etch selective. As can be seen in FIG. 8(*b*), the first masking material layer 710 and the second masking material layer are configured such that a portion of the second masking material layer 730' remains after this step.

A next step 840 includes removing the first masking material layer.

A next step 850 includes etching the substrate. FIG. 8(*c*) shows the resulting structure after the removal of the first masking material layer and etching the substrate. As can be seen, the portion of the second masking material layer 730' remains after this step.

A final step 860 includes removing the remaining portion of the second masking material layer. FIG. 8(*d*) shows the resulting structure after the removing the remaining portion of the second masking material layer. As can be seen, two layers of masking materials are employed to create a structure with four levels.

Although the above described embodiments show different resulting structure configuration, one of ordinary skill in the art will readily recognize that a variety of configurations could be generated. These can be achieved by varying the masking materials, varying the etching process, etc.

Varying embodiments of a method and system for fabricating a structure usable in an imprint lithographic process are disclosed. Through the use of the disclosed embodiments, a binary process is implemented whereby lithography steps are performed prior to the etching steps in the fabrication process. As a result, a structure usable in an imprint lithographic process with complex 3D features, high aspect ratio and multiple levels can be patterned in a more feasible fashion.

Without further analysis, the foregoing so fully reveals the gist of the present invention that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although this invention has been described in terms of certain embodiments, other embodiments that are apparent to those of ordinary skill in the art are also within the scope of this invention, as defined in the claims that follow.

What we claim is:

1. A method of fabricating a structure usable in an imprint lithographic process comprising:
    patterning masking material layers on a substrate thereby forming a multi-layer mask; and
    sequentially removing portions of the substrate based on the multi-layer mask thereby forming a structure usable in an imprint lithographic process wherein the structure comprises a number of levels and wherein the number of levels exceeds a number of masking material layers in the multi-layer mask, wherein the number of masking material layers is n and the maximum number of levels that can be formed is $2^n$, where n is greater than or equal to 3.

2. The method of claim 1 wherein the multi-layer mask comprises a plurality of mutually etch selective masking materials.

3. The method of claim 1 wherein the multi-layer mask and the substrate are mutually etch selective.

4. The method of claim 3 wherein sequentially removing portions of the substrate based on the multi-layer mask further comprises:
    selectively etching the substrate and the multi-layer mask.

5. The method of claim 1 wherein the multi-mask layer comprises any one of the photoresist, chromium and silicon dioxide.

6. The method of claim 5 wherein the substrate comprises a Silicon substrate.

7. The method of claim 1 wherein the substrate comprises a plurality of layers of material and wherein the sequentially removing portions of the substrate comprises removing portions of only the top layer.

8. The method of claim 1 wherein the substrate comprises a plurality of layers including a top layer and at least one layer beneath the top layer and wherein the sequentially removing portions of the substrate comprises removing portions of the top layer and at least one of the layers beneath the top layer.

9. A method of fabricating a structure usable in an imprint lithographic process comprising:
    selectively patterning a number of masking material layers on a substrate thereby forming a multi-layer mask; and
    selectively etching the substrate and the multi-layer mask whereby a resulting structure includes a number of levels and the number of levels is greater than the number of masking material layers, wherein the number of masking material layers is n and the maximum number of levels that can formed is $2^n$ where n is greater than or equal to 3.

10. The method of claim 9 wherein the number of masking material layers comprises a plurality of mutually etch selective masking materials.

11. The method of claim 9 wherein the multi-mask layer comprises any of the photoresist, chromium and silicon dioxide.

12. The method of claim 11 wherein the substrate comprises a Silicon substrate.

* * * * *

UNITED STATES PATENT AND TRADEMARK OFFICE
CERTIFICATE OF CORRECTION

PATENT NO. : 7,718,077 B1
APPLICATION NO. : 11/493478
DATED : May 18, 2010
INVENTOR(S) : Han-Jun Kim et al.

It is certified that error appears in the above-identified patent and that said Letters Patent is hereby corrected as shown below:

In column 7, line 3, in Claim 9, delete "can formed" and insert -- can be formed --, therefor.

Signed and Sealed this

Thirty-first Day of August, 2010

David J. Kappos
*Director of the United States Patent and Trademark Office*